United States Patent [19]
Austin et al.

[11] Patent Number: 6,065,530
[45] Date of Patent: May 23, 2000

[54] WEATHERPROOF DESIGN FOR REMOTE TRANSCEIVER

[75] Inventors: Thomas A. Austin; Matthew K. Meeker; Stephen S. Greer; Dwayne C. Green, all of Santa Rosa, Calif.

[73] Assignee: Alcatel USA Sourcing, L.P., Plano, Tex.

[21] Appl. No.: 09/001,617

[22] Filed: Dec. 31, 1997

Related U.S. Application Data

[60] Provisional application No. 60/048,087, May 30, 1997.

[51] Int. Cl.[7] ................................... H05K 7/20
[52] U.S. Cl. .................. 165/80.3; 174/16.3; 361/690; 361/707; 165/185
[58] Field of Search ................. 165/80.3, 185; 361/690, 704, 703, 707; 174/16.3, 16.1; 257/721, 722

[56] References Cited

U.S. PATENT DOCUMENTS

| | | |
|---|---|---|
| 3,091,736 | 5/1963 | Germain . |
| 3,421,578 | 1/1969 | Marton ............................ 165/80.3 X |
| 3,780,798 | 12/1973 | Reimer ............................ 361/690 X |
| 4,002,955 | 1/1977 | Eggert et al. . |
| 4,237,521 | 12/1980 | Denker . |
| 4,414,604 | 11/1983 | Matsui et al. . |
| 4,765,400 | 8/1988 | Chu et al. ............................ 165/185 |
| 4,771,365 | 9/1988 | Cichocki et al. . |
| 4,963,966 | 10/1990 | Harney et al. . |
| 4,997,034 | 3/1991 | Steffen et al. ..................... 165/185 X |
| 5,030,793 | 7/1991 | McCarthy . |
| 5,065,278 | 11/1991 | Schultz . |
| 5,089,935 | 2/1992 | Ito . |
| 5,150,278 | 9/1992 | Lynes et al. ......................... 361/690 |
| 5,267,122 | 11/1993 | Glover et al. ....................... 361/704 |
| 5,283,716 | 2/1994 | Banitt et al. ..................... 361/690 X |
| 5,381,314 | 1/1995 | Rudy, Jr. et al. . |
| 5,506,373 | 4/1996 | Hoffman . |
| 5,513,071 | 4/1996 | LaViolette et al. ................ 361/703 |
| 5,930,113 | 7/1999 | McCann ............................ 361/704 |

FOREIGN PATENT DOCUMENTS

| | | | |
|---|---|---|---|
| 3710198 | 10/1988 | Germany | ............. 361/690 |

*Primary Examiner*—Leonard Leo
*Attorney, Agent, or Firm*—Fliesler, Dubb, Meyer & Lovejoy LLP

[57] ABSTRACT

An enclosure which acts as a heat sink for dissipating heat generated by electronic components within the housing. The outer surface of the enclosure includes numerous cooling fins, preferably on all six faces of the enclosure, to help dissipate heat. The fins are diagonally oriented, rather than vertical or horizontal, to permit them to be effective whether the unit is mounted horizontally or vertically. In addition to dissipating heat, the enclosure is rain tight, EMI-tight and ESD-tight. The inside major surfaces of the enclosure include a number of pins extending inwardly to help increase the surface area for heat transfer into the enclosure material. The pins extend deeply into the interior of the enclosure, and are made shorter only where necessary to avoid large components on the printed circuit card. The spaces between the pins allow convection of the heated air whether the enclosure is vertically or horizontally mounted. The fins and pins together maximize heat dissipation from the electronics within the enclosure regardless of whether the enclosure is vertically or horizontally mounted.

7 Claims, 3 Drawing Sheets

WEATHERPROOF DESIGN FOR REMOTE TRANSCEIVER

CLAIM OF PRIORITY

This application claims the benefit of U.S. Provisional Application No. 60/048,087, filed May 30, 1997.

BACKGROUND OF THE INVENTION

1. Field of the Invention

The present invention relates to enclosures for telecommunications equipment, and in particular to an enclosure capable of removing heat generated from the telecommunications equipment regardless of the orientation of the enclosure.

2. Description of Related Art

Optical network units may be located between a main switching station and individuals' homes to multiplex, demultiplex, and otherwise boost a telecommunications signal. Such equipment may be mounted within an enclosure generally located either on a telephone pole, on a telephone cable between telephone poles, on a ground-based pedestal, or within a handhole underground. The equipment must meet strict reliability standards, and the enclosures must be able to protect the equipment against the elements and electromagnetic radiation, often in remote areas not easily or readily accessible for repair.

The electronics of the telecommunications equipment generate heat with operation, which heat must be dissipated to prevent overheating of the equipment. It is known to provide some sort of cooling mechanism within or as part of an enclosure for such purposes. For example, U.S. Pat. No. 5,267,122 to Glover et al. discloses fins on internal and external surfaces of the enclosure for receiving radiated and convected heat energy from the electronic components within the enclosure, and dissipating the heat to the surrounding environment. It is also known to provide heat exchangers utilizing a working fluid for carrying the generated heat away, and further to provide fans for cooling high-wattage electronic components.

Increased electronic integration and higher functionality of the electronics within the enclosure tend to require greater power and higher wattages. Conventional heat removal systems do not satisfactorily remove heat from these high wattage components. While fans and other moving parts may be included to remove heat from higher wattage units, these units must include a power supply, and the moving parts and power supplies are often prone to break down. Finally, as hot air is lighter than cool air, convection of heated air within the enclosures moves in an upward direction. Conventional heat-removing fins must be oriented in a way so as not to obstruct the upward convection of the heat air away from the heat-generating electronics, i.e., the fins cannot be horizontal on the enclosures. This alignment of the fins presents limitations on how the enclosure may be oriented when mounted.

SUMMARY OF THE INVENTION

It is therefore an advantage of the present invention to provide an enclosure for an optical network unit, which enclosure dissipates heat generated from electronic components housed within the unit.

It is a further advantage of the present invention to provide an enclosure which can dissipate heat generated from electronic components housed therein whether the enclosure is vertically or horizontally mounted.

It is another advantage of the present invention to maximize the surface area available on both the inner and outer surfaces of the enclosure for absorbing and dissipating heat, whether the enclosure is vertically or horizontally mounted.

These and other advantages are provided by the present invention, which in preferred embodiments relates to an enclosure which acts as a heat sink for dissipating heat generated by electronic components within the housing. The outer surface of the enclosure includes numerous cooling fins, preferably on all six faces of the enclosure, to help dissipate heat. The fins are diagonally oriented, rather than vertical or horizontal, to permit them to be effective whether the unit is mounted horizontally or vertically. In addition to dissipating heat, the enclosure is rain tight, EMI-tight and ESD-tight.

The inside major surfaces of the enclosure include a number of pins extending inwardly to help increase the surface area for heat transfer into the enclosure material. The pins extend deeply into the interior of the enclosure, and are made shorter only where necessary to avoid large components on the printed circuit card. The spaces between the pins allow convection of the heated air whether the enclosure is vertically or horizontally mounted.

A base of the enclosure includes a pair of opposed shelves on the sides of the base, and a cover of the housing includes a pair of opposed blades on sides of the cover. When the motherboard is mounted in the enclosure, and the cover is sealed to the base, the board is sandwiched between the shelves and blades to fix the board in place without the use of screws or other similar fasteners. A ground ring is disposed all the way around the edge of the motherboard on both top and bottom surfaces. The ground ring on the top surface of the motherboard makes thermal contact with the blades to aid in heat transfer. The ground ring on the underside of the motherboard makes thermal and electrical contact with the shelf, in order to assist both with thermal transfer and with EMI and ESD protection. The hotter components on the motherboard are preferably located near to the ground ring around the outer edge of the board.

BRIEF DESCRIPTION OF THE DRAWINGS

Embodiments of the present invention will now be described with reference to the drawings in which.

DETAILED DESCRIPTION

The present invention in general relates to an enclosure for housing electronics, which enclosure is configured to allow a high rate of heat dissipation from the electronics whether the enclosure is vertically or horizontally mounted. While the preferred embodiment of the enclosure is included as part of an optical network unit which houses telecommunications electronics, it is understood that the present invention may be used to cool various other electronic systems. Moreover, it is understood that the optical network units including the enclosure according to the present invention may be mounted at various locations, including but not limited to telephone poles, telephone cables between telephone poles, ground-based pedestals, or within a handhole underground.

Figure 1:
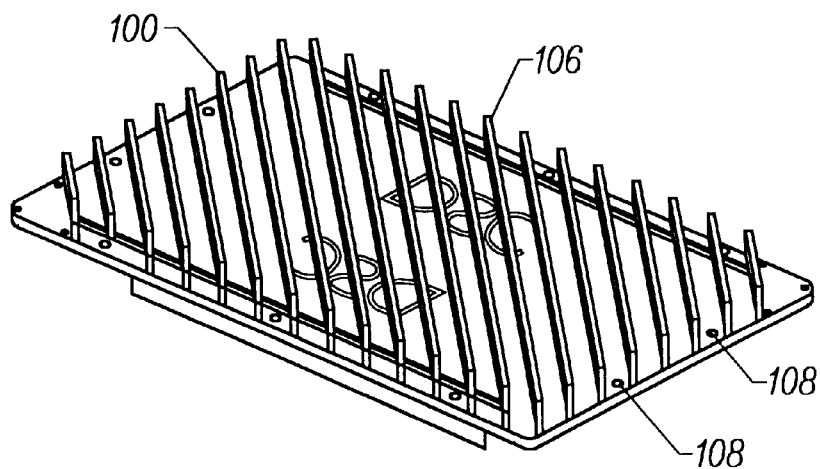
FIG. 1 is a perspective view of an upper surface of the cover.
Figure 2:
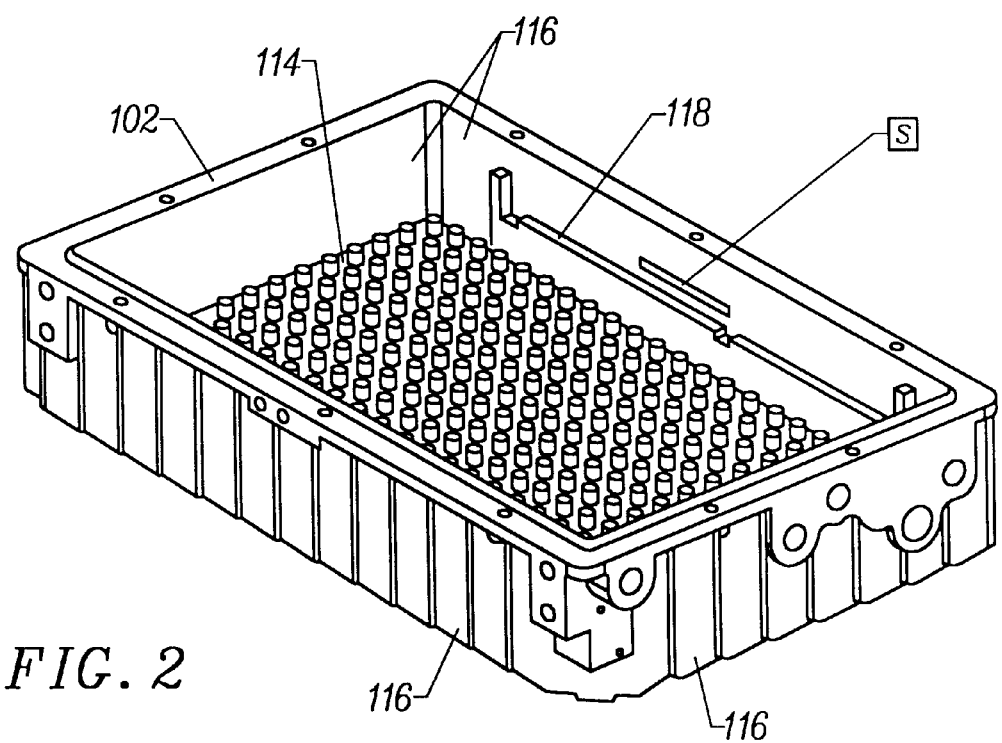
FIG. 2 is a perspective view of an upper surface of the base.
Figure 3:
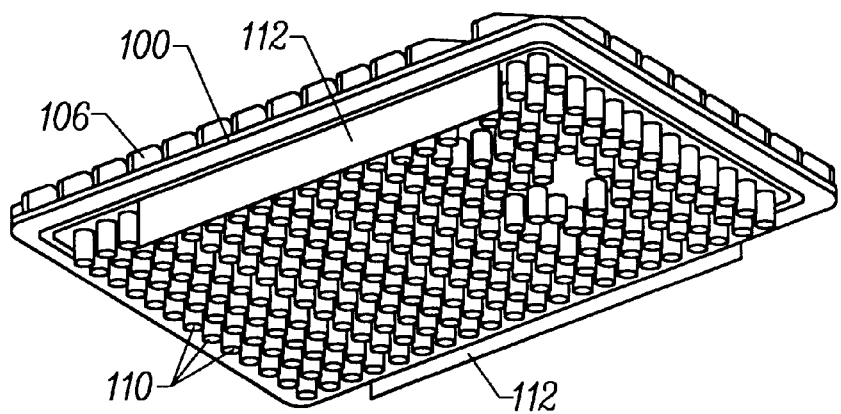
FIG. 3 is a perspective view of a lower surface of the cover.
Figure 4:
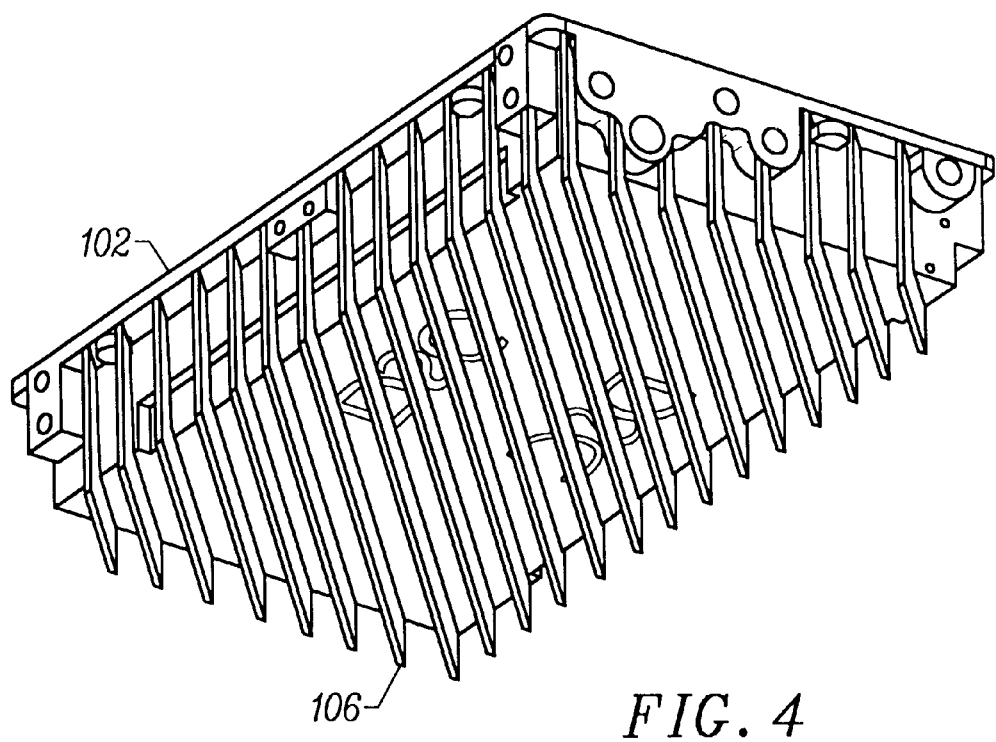
FIG. 4 is a perspective view of a lower surface of the base.
Figure 5:
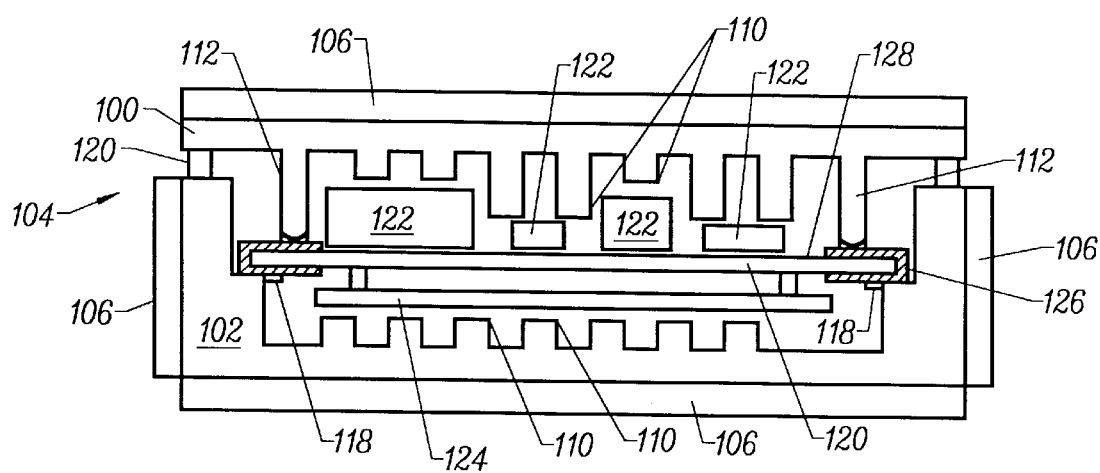
FIG. 5 is a cross-sectional end view of the enclosure including the cover mounted to the base and electronic circuit boards mounted therebetween.

FIGS. 1 and 2 show a top perspective view of a cover 100 and base 102, respectively, which cover and base together comprise an enclosure 104 (FIG. 5). FIGS. 3 and 4 show bottom perspective views of the top 100 and base 102, respectively. Referring now to FIGS. 1 and 3, cover 100 is preferably formed of heavy cast aluminum alloy, having a length of approximately 15 inches and a width of approximately 9.3 inches. It is understood that cover 100 may be formed of other materials having good conductivity, and to other dimensions. As shown specifically in FIG. 1, the upper surface of cover 100 includes a plurality of diagonally oriented fins 106. In a preferred embodiment, the fins form an angle of approximately 45° with the horizontal, but the diagonal fins may form any angle with the horizontal substantially greater than 0°. In one embodiment, each of the fins may be separated approximately 0.75 inches from each other, and extend approximately 0.75 inches above the surface of cover 100. Additionally, each of the fins may be approximately ⅛ to ¼ inches thick at their base with a slight draft angle, such as for example 1.5°, for ease of manufacturability. The thickness of the cover, not including the fins 106 or pins 110 (explained hereinafter), is approximately 0.20 inches. It is understood that each of the above-mentioned dimensions are by way of example, and may vary in alternative embodiments of the invention. The cover 100 may further include a plurality of holes 108 for receiving screws or rivets (not shown). It is understood that if access to the interior of enclosure 104 is to be provided, holes 108 preferably receive removable screws.

Referring specifically now to FIG. 3, a lower surface of cover 100 includes a plurality of pins 110 extending down from the lower surface of the cover. Cover 100 further includes a pair of blades 112 extending down from the bottom surface of the cover along opposed sides of the cover. The pins 110 and/or the blades 112 may be formed integrally on the cover 100 during the casting process from which the cover 100 is formed. Alternatively, the pins 110 and/or the blades 112 may be mounted to a piece of sheet metal which is affixed to the underside of the cover 100 subsequent to the formation of the cover 100. In this latter embodiment, it is understood that the pins 110 and/or blades 112 may be formed from a different material than the remaining sections of the cover 100.

Referring now to FIGS. 2 and 4, the base 102 preferably includes a bottom 114 and sides 116. Base 102 may have a depth of approximately 2.5 inches, and a length and width of approximately 15 inches and 9.3 inches, respectively, to match the footprint of the cover. Additionally, as with the cover, the thickness of the bottom 114 and sides 116, not including the fins 106 or pins, is approximately 0.20 inches. It is understood that these dimensions may vary in alternative embodiments of the invention. As shown in FIG. 4, the base 102 preferably includes a plurality of fins 106 on a lower surface of base 114 and around sides 116. The spacing and configuration of the fins 106 may be identical to those of the fins 106 on cover 100. As shown in FIG. 2, base 102 includes a plurality of pins 110 extending up from the bottom 114, and a pair of shelves 118 on opposed sides 116 of the base 102 (one such shelf 118 being shown in FIG. 2).

As indicated in the Background of the Invention section, electronic components 122 (FIG. 5) generate heat which is absorbed into the enclosure 104 via radiation and conduction. The elevated temperature of the enclosure in turn heats the air surrounding the enclosure, thereby causing the heated air to rise. This air convection adjacent the surfaces of the enclosure carries away the heat from the enclosure. The fins 106 maximize the surface area on the enclosure in contact with the moving air, thereby maximizing the transfer of heat away from the cover.

The faster the air moves around the outer surface of the enclosure, the faster heat will be carried away from the enclosure. If the enclosures were always mounted in the same orientation (i.e. with the enclosure's length horizontally oriented), then the fins 106 could ideally be oriented vertically (i.e., perpendicular to the length of the enclosure). However, in some applications, it is desirable to mount the enclosure with its length horizontally oriented, and in other applications it is desirable to mount the enclosure with its length vertically oriented. If the fins were vertical, they would work for one application, but in the other application, the fins would be horizontally oriented. This would be problematic in that a horizontal orientation of the fins would substantially block air flow adjacent the enclosure. By diagonally orienting the fins 106 on the enclosure 104, the enclosure may be either vertically or horizontally mounted without substantially interfering with the movement of the heated air as it rises adjacent to the enclosure. Thus, the diagonal orientation of the fins greatly increase the flexibility with regard to how the enclosure 104 may be mounted. Moreover, by providing continuous fins (as opposed to a segmented fin with spaces along its length), the surface area available to absorb heat is maximized.

While a preferred embodiment of the invention includes diagonal fins around the six major outer surfaces of the enclosure, it is understood that other protrusions from the enclosure may be used instead of fins 106. For example, pins similar to pins 110 may be used. It is understood that whatever the construction of the protrusions from the enclosure, they should provide a pathway for the heated air to rise upward, regardless of whether the enclosure is vertically or horizontally mounted.

As with fins 106, the pins 110 increase the surface area on the interior of the enclosure to maximize the amount of heat which may be absorbed into the enclosure and away from the electronics. In a preferred embodiment, the pins 110 may be circularly shaped. However, it is understood that the shape of pins 110 may vary in alternative embodiments. Additionally, instead of pins 110, it is understood that other protrusions on the interior of the enclosure may be used instead of pins 110. For example, diagonal fins similar to pins 106 may be used. It is understood that whatever the construction of the protrusions into the interior of the enclosure, they should provide a pathway for the heated air to rise upward, regardless of whether the enclosure is vertically or horizontally mounted. The fins 106 on the outside of the enclosure and the pins 110 on the inside of the enclosure together provide an improved passive (i.e., no moving or powered parts) cooling system for removing heat from the electronic components within the enclosure.

FIG. 5 shows a cross-sectional end view of the top 100 affixed to the base 102. A gasket 120 may be provided around the mating surfaces between the base and cover to provide an environmental and electromagnetic radiation barrier between the interior and exterior of enclosure 104. Enclosure 104 is provided to house a motherboard 120 having control electronics 122 mounted thereon. A daughterboard 124 may additionally be mounted within the enclosure 104 having further electronics (not shown) mounted thereon.

As shown in FIGS. 3 and 5, the length of the pins 110 on the cover 100 may vary depending upon the height of electronics 122 mounted on motherboard 120. Thus, the pins 110 which overlie relatively flat electronic components 122 may be relatively long so as to maximize the surface area of the cover. Conversely, pins 110 which overlie relatively thick electronic components are relatively short so as not to contact these electronic components. In this way, the length of pins 110, and consequently the surface area on the cover for carrying away heat, may be maximized for a particular motherboard configuration. It is understood that the length of pins 110 in the base 102 may additionally or alternatively vary in length where such pins are juxtaposed to electronic components on a circuit board.

Once the cover 100 is secured to the base 102, the motherboard 120 is sandwiched between blades 112 from the cover and shelves 118 on the base. The blades 112 may include rubber tips so as to secure the circuit boards between the blades and the shelves without damaging the boards. Additionally, the rubber tips are formed from a material that is preferably an electrical insulator and a good thermal conductor. By fixing boards 120 and 124 between the blades 112 and shelves 118, the circuit boards may be held in a fixed position within the enclosure 104 without screws or other similar fasteners.

A ground ring 126 may be exposed on the outer circumference of motherboard 120. The ground ring on the top surface of the motherboard 120 makes thermal contact with the blades 112 to aid in heat transfer. The ground ring on the underside of motherboard 120 makes thermal and electrical contact with the shelves 118 to assist in both thermal transfer and protection against electromagnetic radiation. The electronic components 122 on the motherboard 120 which generate the most heat are preferably placed closer to the edges of the board 120 to take advantage of the thermal conductivity of ground ring 126. To further aid in heat dissipation, a chassis ground 128 may extend from the edge of the ground ring to underneath the hotter components on the motherboard. Such hotter components may be mounted on a thermally conductive dielectric pad connected to the chassis ground to electrically insulate the electronic component and to assist in conducting heat away from such components.

As shown in FIGS. 2 and 4, one end of the housing may include a light pipe 130 to allow external viewing of an internal red or green LED mounted on the printed circuit boards. The light pipe may be sealed with a weather tight seal. The enclosure 104 may be potted with stub wiring and hermetically sealed. As shown in FIGS. 2 and 4, the enclosure 104 may include a plurality of holes 132 for receiving various kinds of cable and fiber. Whichever of holes 132 is not used for wiring may be plugged with a hermetic seal.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. An enclosure for dissipating heat from an electronic component within the enclosure, the enclosure having a length, comprising:

a plurality of protrusions on an inner surface of the enclosure for increasing an interior surface area of the enclosure for receiving heat from the electronic component, said plurality of protrusions allowing heated air to flow upward adjacent said inner surface whether the enclosure is vertically or horizontally oriented with respect to the length of the enclosure; and a plurality of continuous, diagonal fins on an outer surface of the enclosure for increasing an exterior surface area of the enclosure for dissipating heat from the enclosure to air around the enclosure, said plurality of fins allowing heated air to flow upward adjacent said outer surface whether the enclosure is vertically or horizontally oriented with respect to the length of the enclosure.

2. An enclosure as recited in claim 1, wherein said plurality of protrusions comprise pins.

3. An enclosure for dissipating heat from a plurality of electronic components mounted on a board within the enclosure, the enclosure having a length, comprising:

a plurality of protrusions on an inner surface of the enclosure, extending inward toward a center of the enclosure, for increasing an interior surface area of the enclosure for receiving heat from the plurality of electronic components, wherein a length of a protrusion of said plurality of protrusions is determined by a height above the board of an electronic component of the plurality of electronic components over which electronic component said protrusion is to be positioned.

4. An enclosure as recited in claim 3, said plurality of protrusions allowing heated air to flow upward adjacent said inner surface whether the enclosure is vertically or horizontally oriented with respect to the length of the enclosure.

5. An enclosure as recited in claim 3, wherein said plurality of protrusions comprise pins.

6. An enclosure for dissipating heat from a plurality of electronic components mounted on a board within the enclosure, the enclosure having a length, comprising:

a plurality of protrusions on an inner surface of the enclosure, extending inward toward a center of the enclosure, for increasing an interior surface area of the enclosure for receiving heat from the plurality of electronic components, said plurality of protrusions allowing heated air to flow upward adjacent said inner surface whether the enclosure is vertically or horizontally oriented with respect to the length of the enclosure, wherein a length of a protrusion of said plurality of protrusions is determined by a height above the board of an electronic component of the plurality of electronic components over which electronic component said protrusion is to be positioned; and a plurality of continuous, diagonal fins on an outer surface of the enclosure for increasing an exterior surface area of the enclosure for dissipating heat from the enclosure to air around the enclosure, said plurality of fins allowing heated air to flow upward adjacent said outer surface whether the enclosure is vertically or horizontally oriented with respect to the length of the enclosure.

7. An enclosure for dissipating heat from a plurality of electronic components on a board within the enclosure, the enclosure having a length, comprising:

a base, including:

a first plurality of protrusions on an inner surface of said base, extending inward toward a center of the enclosure, for increasing an interior surface area of said base for receiving heat from the plurality of electronic components, said first plurality of protrusions allowing heated air to flow upward adjacent said inner surface whether the enclosure is vertically or horizontally oriented with respect to the length of the enclosure, wherein a length of a protrusion of said plurality of protrusions is determined by a height above the board of an electronic component of the plurality of electronic components over which electronic component said protrusion is to be positioned, a first plurality of continuous, diagonal fins on an outer surface of said base for increasing an exterior surface area of said base for dissipating heat from the enclosure to air around the enclosure, said first plurality of fins allowing heated air to flow upward adjacent said outer surface whether the enclosure is vertically or horizontally oriented with respect to the length of the enclosure, and a pair of shelves formed along sides of said base; and a cover, including:

a second plurality of protrusions on an inner surface of said cover, extending inward toward the plurality of electronic components, for increasing an interior surface area of said cover for receiving heat from the plurality of electronic components, said second plurality of protrusions allowing heated air to flow upward adjacent said inner surface whether the enclosure is vertically or horizontally oriented with respect to the length of the enclosure, and at least one of said protrusions being shorter than others of said plurality of protrusions to avoid contact with a large electronic component of the plurality of electronic components, a second plurality of continuous, diagonal fins on an outer surface of said cover for increasing an exterior surface area of said cover for dissipating heat from the enclosure to air around the enclosure, said second plurality of fins allowing heated air to flow upward adjacent said outer surface whether the enclosure is vertically or horizontally oriented with respect to the length of the enclosure, and a pair of blades extending from said inner surface of said cover toward the plurality of electronic components, along sides of said cover, said pair of blades and said pair of shelves together holding said plurality of electronic components in a fixed position within said enclosure.

* * * * *